United States Patent [19]

Sachs

[11] Patent Number: 4,521,667

[45] Date of Patent: Jun. 4, 1985

[54] METHOD FOR THE MANUFACTURE OF A DEVICE FOR THE READ-OUT OF A TWO-DIMENSIONAL IMAGE PATTERN WITH AN ARRAY

[75] Inventor: Bertram Sachs, Erlangen, Fed. Rep. of Germany

[73] Assignee: Siemens Aktiengesellschaft, Berlin and Munich, Fed. Rep. of Germany

[21] Appl. No.: 568,479

[22] Filed: Jan. 5, 1984

[30] Foreign Application Priority Data

Jan. 12, 1983 [DE] Fed. Rep. of Germany ....... 3300831

[51] Int. Cl.$^3$ ............................................. B23K 27/00
[52] U.S. Cl. ................................ 219/121 LJ; 29/847; 219/121 LH; 361/414
[58] Field of Search ................. 219/121 LH, 121 LJ, 219/121 EJ, 121 EK; 29/847, 846; 361/412, 414; 367/105

[56] References Cited

FOREIGN PATENT DOCUMENTS 6469 1/1974 Japan ..................................... 29/846
168989 12/1981 Japan ........................... 219/121 LH Primary Examiner—C. L. Albritton
Attorney, Agent, or Firm—Mark H. Jay

[57] ABSTRACT

Method for facilitating the fabrication of a read-out device having large stacked printed circuit boards, each of which is provided on one of its faces with switch-selected amplifiers and to each of which a leak resistance is assigned and each of which is provided on one of its narrow sides and on a portion of the adjacent face that is equipped with the leak resistance with a thin film of electrically conductive material. According to the invention, in order to separate the thin film on the narrow sides and on the faces into individual electrodes, a laser beam is conducted over the narrow edges of the stacked printed circuit boards. This process makes it possible to divide several, preferably several hundred, narrow sides and faces simultaneously into individual electrodes in a single cutting procedure.

3 Claims, 1 Drawing Figure

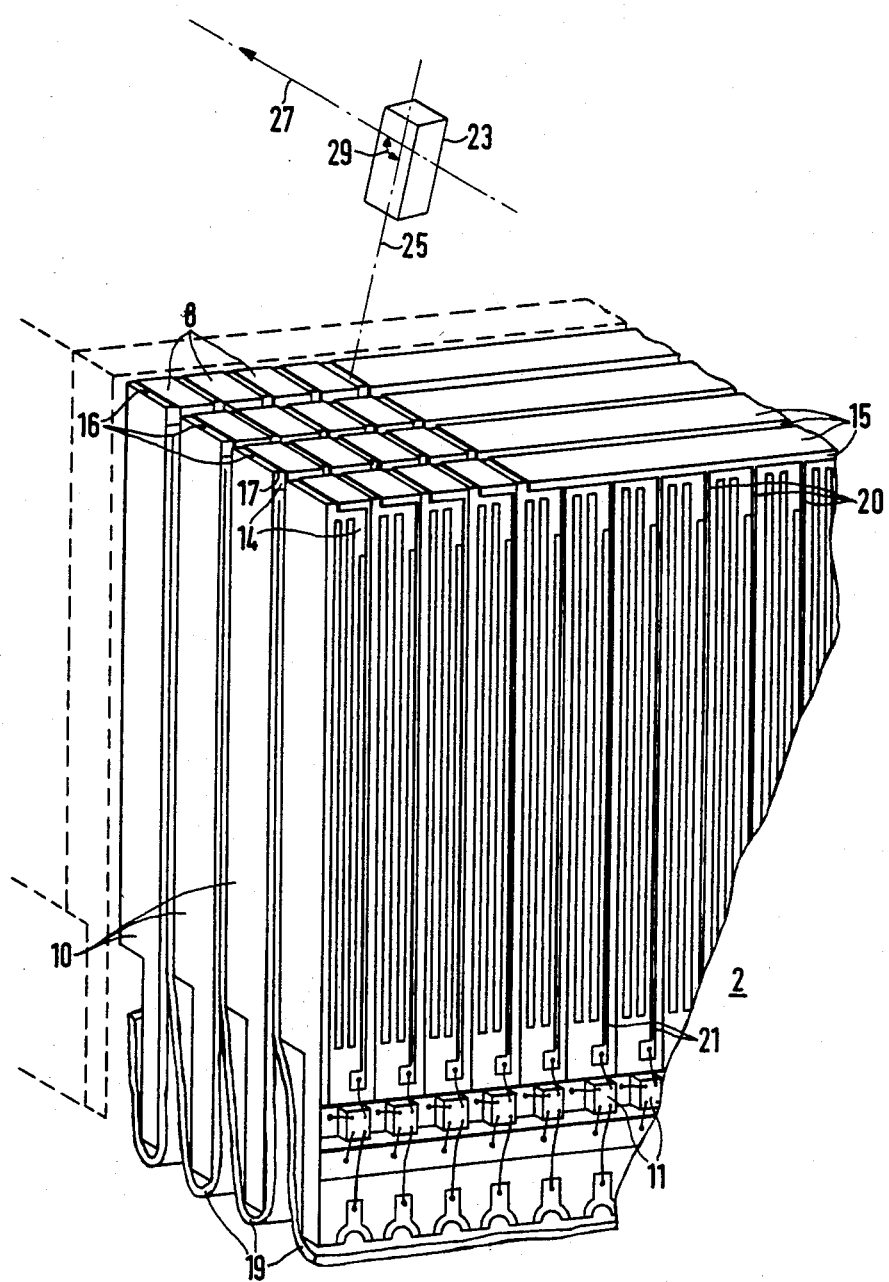

METHOD FOR THE MANUFACTURE OF A DEVICE FOR THE READ-OUT OF A TWO-DIMENSIONAL IMAGE PATTERN WITH AN ARRAY

BACKGROUND OF THE INVENTION

This invention is related to a method for the manufacturing of a device for reading-out of a two-dimensional charge image stored in an array.

The device consists of stacked printed circuit boards, each of which is provided on one of its large faces with switch-selected amplifiers, to each of which a leak resistance is assigned, and each of which is provided on one its narrow sides, and on a portion of the adjacent large face that is equipped with leak resistances, with a thin film of electrically conductive material. In this device, one large face of each of the printed circuit boards is provided with a recess running parallel to the narrow side. To the electrodes of each printed circuit board, a switch-selected amplifier, for example, a dual-gate MOSFET, is assigned. The amplifiers are arranged one behind the other along the longitudinal axis of the recess. The connecting lines are at least approximately of the same length between each electrode and the corresponding switch-selected amplifier. The main control lines are arranged on the narrow sides of the printed circuit boards that are opposite the electrodes, in the direction of the columns, which in each case provides an electrically conducting connection between the control lines for the switch-selected amplifiers of the printed circuit boards, when the respective lines belong the the same columns. The ground lines of the printed circuit boards are connected outside the printed circuit boards to a ground bus.

The device itself, is described in a pending patent application entitled "Array Apparatus for the Reording Out A Two-Dimensional Charge Image," Ser. No. 503,798, filed June 13, 1983. The contents of the '798 application are herein incorporated by reference.

In manufacturing this device, it is customary to arrange and construct the connecting lines on a common face of the printed circuit boards and the control lines, as well as the signal line, the ground line and the leak resistances by using thin-film technology. For this purpose, the narrow side and the adjacent large face are covered over their entire surface with a thin film of electrically conductive material. This thin film is preferably vapor-deposited, in particular, sputtered on. Next, familiar lithographic methods are used to form the connecting lines, the control lines, the signal line, the ground line and the leak resistances, by removing the superfluous parts of the applied film. The division of the thin film on the narrow side into individual electrodes can, for example, be accomplished by means of a saw. Photographic methods can also be used to produce the individual electrodes from the thin film.

SUMMARY OF THE INVENTION

It is an object of the present invention to provide an improved method for manufacturing the device; in particular, the manufacture of the electrodes on the narrow sides of the printed circuit boards is to be simplified.

This object, as well as others, are achieved according to the invention by means of the characteristic feature described in claim 1. The process makes it possible to divide the thin film on the narrow side and the large face of each of a considerable number, preferably several hundred, of printed circuit boards into individual electrodes. According to the process, a laser beam is conducted over the narrow sides of the printed circuit boards to divide the thin film on the narrow sides and on the faces into individual electrodes. By using this process, it is possible to obtain in each case a greater number of electrodes on the narrow sides of the printed circuit boards and, as a result, a greater resolution of the charge image, and cuts in the $\mu$m range can be made. In addition, with this division of the thin film into individual electrodes, no chips, which could under certain circumstances prevent a clean division of the printed boards into individual elements, are produced.

Other features and advantages of the invention will be apparent from the following description of the preferred embodiments and from the claims.

For a full understanding of the present invention, reference should now be made to the following detailed description of the preferred embodiments of the invention.

BRIEF DESCRIPTION OF THE DRAWING

The FIGURE shows the array of the stacked printed circuit boards according to the invention.

DETAILED DESCRIPTION

The FIGURE shows a stack 2 of printed circuit boards 10, which are already equipped with components on one of their large faces 14, and out of each of which is to be constructed a module for a device for reading-out of a two-dimensional charge image with an array. The stack 2 contains several, preferably several hundred, stacked printed circuit boards 10, in each of which one of the large faces 14 is provided with switch-selected amplifiers 11 and to each of which a leak resistance 21 is assigned. In each case, one narrow side 16 of the printed circuit boards 10 and a portion of the adjacent large faces 14 that are provided with leak resistances 21 are covered with a thin film of electrically conductive material. The line of intersection of the narrow side 16 with the adjacent large face 14 is an outer edge 17 of the printed circuit board 10. This thin film 15 of the face 14 may be only a few mm wide and thus wires all the connecting lines 20 and accordingly all the leak resistances 21 of the printed circuit boards 10 in parallel. In stacking the individual printed circuit boards 10, a spacer film 19 may be inserted between every two printed circuit boards 10, which is formed from the running meter as a fold between two printed circuit boards 10. Then a laser 23 is conducted over the narrow sides 16 of the stacked printed circuit boards 10 in such a manner that an acute angle 29 is maintained between the laser beam 25 and the path of motion of the laser 23, which is indicated in the FIGURE by an arrow 27. By means of this laser 23 which is conducted over the narrow side 16 of the stacked printed circuit boards 10, the thin film 15 on the narrow sides 16 and the large faces 14 is divided into individual electrodes 8, which accordingly form in each case a connection around an external edge.

With this process it is possible to form electrical connections that lead around external edges. By this means connection points are obtained without projections. This is desirable because such projections would, for example, substantially reduce the sensitivity of a film of polyvinylidene fluoride PVDF, which may subsequently be attached to the electrode 8. In addition, with this process it is possible to construct a correspondingly larger number of electrodes 8 on the narrow sides 16 of the printed circuit boards 10 and, as a result, obtain a greater resolution of the charge image.

There has thus been shown and described a novel method for manufacturing circuit boards which fulfills all the objects and advantages sought therefor. Many changes, modifications, variations and other uses and applications of the subject invention will, however, become apparent to those skilled in the art after considering the specification and the accompanying drawing which discloses a preferred embodiment thereof. All such changes, modifications, variations and other uses and applications which do not depart from the spirit and scope of the invention are deemed to be covered by the invention which is limited only by the claims which follow.

What is claimed is:

1. Method for the manufacturing of a device for reading-out a two-dimensional charge image with an array comprising stacked printed circuit boards, each of which is provided on one of its large faces with switch-selected amplifiers to each of which a leak resistance is assigned, and each of which is provided on one of its narrow faces and on a portion of the adjacent large face that is equipped with leak resistances with a thin film of electrically conductive material, comprising the steps of: conducting a laser beam over said narrow sides of said stacked printed circuit boards to divide said thin film on said narrow sides and said large faces into individual electrodes.

2. Method according to claim 1, wherein an acute angle is maintained between said laser beam and the path of motion of a laser used for generating said beam.

3. Method according to claim 1, comprising the additional step of: inserting a spacer film between every two printed circuit boards prior to said conducting step.

* * * * *